United States Patent
Nakash et al.

(10) Patent No.: US 10,761,129 B2
(45) Date of Patent: Sep. 1, 2020

(54) ELECTRICAL POWER SUPPLY PANEL WITH INCREASED SAFETY THROUGH MONITORING AND CONTROL

(71) Applicants: Shimi Nakash, Azor (IL); Zaki Dosh, Azor (IL); Eli Dosh, Azor (IL)

(72) Inventors: Shimi Nakash, Azor (IL); Zaki Dosh, Azor (IL); Eli Dosh, Azor (IL)

(*) Notice: Subject to any disclaimer, the term of this patent is extended or adjusted under 35 U.S.C. 154(b) by 26 days.

(21) Appl. No.: 16/373,638

(22) Filed: Apr. 3, 2019

(65) Prior Publication Data
US 2019/0302175 A1  Oct. 3, 2019

Related U.S. Application Data

(60) Provisional application No. 62/651,733, filed on Apr. 3, 2018.

(51) Int. Cl.
*G01R 31/28* (2006.01)
*G01R 27/18* (2006.01)
(Continued)

(52) U.S. Cl.
CPC ......... *G01R 31/2827* (2013.01); *G01R 27/18* (2013.01); *G01R 31/086* (2013.01);
(Continued)

(58) Field of Classification Search
CPC .. G01R 31/2827; G01R 27/18; G01R 31/086; H02H 3/32; H02H 3/325; H02H 1/0092; H02H 6/00
See application file for complete search history.

(56) References Cited

U.S. PATENT DOCUMENTS 5,729,145 A * 3/1998 Blades .............. G01R 31/1272
324/536
7,282,921 B2 10/2007 Sela et al.
(Continued)

FOREIGN PATENT DOCUMENTS

| CN | 103001194 | 3/2013 |
| CN | 103633568 | 3/2014 |

(Continued)

OTHER PUBLICATIONS

Extended European Search Report, European Application No. 19167009, dated Aug. 20, 2019.
(Continued)

*Primary Examiner* — Alvaro E Fortich
*Assistant Examiner* — Zannatul Ferdous
(74) *Attorney, Agent, or Firm* — The Roy Gross Law Firm, LLC; Roy Gross (57) ABSTRACT

A method for monitoring, metering and improving system parameters, including leakage sensitivity and response over a time period in an electrical panel for a single phase system, or a 3-phase system comprising phase lines X, Y and Z, wherein the system reaction and accuracy are critical to a decision to disconnect the line with the malfunction before operation of the leakage breaker to cut off power. Set parameter 1: a leakage threshold in mA that can be changed in system setup mode. Set parameter 2: Allowable deviation in mA for alert; and set parameter 3: Maximum deviation in mA to disconnect currents. Set parameter N for the time to include in an average calculation.

15 Claims, 7 Drawing Sheets

(51) Int. Cl.
*G01R 31/08* (2020.01)
*H02H 3/32* (2006.01)
*H02H 1/00* (2006.01)
*H02H 6/00* (2006.01)

(52) U.S. Cl.
CPC .............. *H02H 3/32* (2013.01); *H02H 3/325* (2013.01); *H02H 1/0092* (2013.01); *H02H 6/00* (2013.01)

(56) References Cited

U.S. PATENT DOCUMENTS

| | | | |
|---|---|---|---|
| 8,566,047 B2 | 10/2013 | Montreuil et al. | |
| 9,197,055 B2 | 11/2015 | Curtis et al. | |
| 2013/0258537 A1* | 10/2013 | Wylie | H02H 3/08 361/87 |
| 2016/0033565 A1* | 2/2016 | Reid | G01R 31/006 324/503 |
| 2017/0222424 A1 | 8/2017 | Fukuo et al. | |

FOREIGN PATENT DOCUMENTS

| | | |
|---|---|---|
| CN | 103715652 | 4/2014 |
| CN | 103887660 | 6/2014 |
| EP | 0069655 | 1/1983 |
| EP | 2109202 | 10/2009 |
| EP | 1435127 | 11/2015 |
| GB | 2318002 | 4/1998 |
| GB | 2545460 | 6/2017 |
| RU | 2604868 | 12/2016 |

OTHER PUBLICATIONS

Managing the Energy Impact on Our Future, https://smarthomeontario.files.wordpress.com/2014/03/ksi-application-fact-sheet.pdf, retrieved May 18, 2020.

Title: Managing the Energy Impact on Our Future https://smarthomeontario.files.wordpress.com/2014/03/ksi-application-fact-sheet.pdf.

\* cited by examiner fig 1

ELECTRICAL POWER SUPPLY PANEL WITH INCREASED SAFETY THROUGH MONITORING AND CONTROL

FIELD OF THE INVENTION

The present invention relates to electrical accessories in general, and more particularly to a controller for an electrical panel.

BACKGROUND OF THE INVENTION

Electric panels generally include circuit breakers, ground connectors, cable terminals, phase connectors, among other electric circuit components. The electricity supply usually comes from an outside source through automatic or semi-automatic transfer switches, and is conducted through circuit breaker that protect from damage caused by excess current from an overload or short circuit.

Electric panels generally do not include safety means, which provide an indication regarding the quality and condition of the ground, and/or the RCD (residual current device), the circuit breakers, condition of phase and neutral connections, and these panels generally do not include products and accessories which provide protection in case of power surges and blackouts.

Leakage circuit breakers, also known as residual current devices (RCD's), residual current circuit breakers (RCCB's) or ground fault interrupters (GFI's), and others, installed in accordance with standard International Electrotechnical Commission' are defined to disconnect the current in the case of an excessive leakage current greater than 30 mA or other. A leakage current is defined as a case where there is a difference (differential) between the current flow in the phase line and the current flow in the neutral line. According to electrical system theory, the current in both lines should be the same. If there is leakage current, generally it flows to the ground line.

The existence of leakage current is identified as a situation where a person may receive an electric shock and the RCD is installed as a safety measure to protect against electrocution and even death.

In accordance with standard practice, a leakage current of 30 mA is determined as the maximum current value that can pass through a healthy human body and will not cause irreversible damage. But as regards unhealthy or underage persons, electrocution from hand to hand or wet/bare-feet will cause permanent damage and even death.

The main reason that the RCDs disconnect the current only at 30 mA rather than at lower leakage current values is because there is unpredicted current leakage in the power lines or from electrical products at different low and cumulative values. In order not to cause false current disconnections of the line, the RCD's are set for the maximum current value a healthy man can suffer.

However, RCDs do not protect the users against electrocution in all cases.

The following cases illustrate the exposure of users to the risk of electric shock, injury or even death, despite the use of RCD/leakage circuit breakers:

1. RCD's are not sensitive enough to disconnect the current supply in situations of leakage current lower than 30 mA.
2. The standard leakage RCD's will not protect users if not properly grounded.
3. Standard leakage RCD's will not protect users if the neutral line is not working properly, and the risk for severe injury is higher in 3-phase power boards.
4. In accordance with the instructions of the RCD manufacturers, a test should be performed once a month for proper operation of the RCD by pressing the test button located on the RCD. According to surveys, most users never perform the test.

There are known cases where a proper RCD was installed on a power board and people were electrocuted to death because there was no proper grounding in the structure and the discharge circuit did not detect leakage currents.

Thus, it would be advantageous to provide a solution to the abovementioned problems.

SUMMARY OF THE INVENTION

An aspect of the present invention relates to a system to monitor electrical parameters of components in an electrical panel and to report on any variations in the parameters outside of a normal operating range.

In accordance with an embodiment of the present invention, the monitoring system includes a controller and a plurality of sensors which sense parameters such as voltage, current, temperature, and electrical resistance among other possible parameters. The controller, responsive to data received from the sensors, transmits the information to a user computing device, which may include a PC, laptop, smartphone, tablet, among other possible computing devices, and/or may display the information in a display proximal to the electrical panel or on the electrical panel.

The electrical panel monitoring information may be transmitted using wireless communications, for example, by Wi-Fi, Bluetooth, and/or GSM communications, and may additionally include use of wired communications. The parameters measured by the sensors and processed by the controller may be per line or conductor, and the information transmitted and optionally stored in a database in the system may be per line or conductor, thereby enabling quick identification of the faulty line or conductor.

In some embodiments, the system monitors, in each line, the supply voltage, grounding, neutral line, leakage, temperature of conductors, and temperature of the panel among other parameters in real time. Upon detection of a parameter which is outside the normal operation range, the controller activates an electrical cut-off device (e.g. relay) to cut off power to the panel. Optionally, the controller may activate an audible alarm in the electric panel and/or in the computing device to alert of the fault.

In some embodiments, the system tests for current leakage by comparing the current and phase in each line with the current in the neutral line and/or monitors for the presence of a voltage in the ground line. If the leakage current is determined to exceed a maximum permissible level or has experienced an abnormal variation, the controller may cut off power to the electrical panel before the main circuit breaker is activated, or may optionally cut off power to the faulty line.

In accordance with an embodiment of the present invention, there is provided a system for an electrical panel with the features described below, installed in addition to or in place of the standard components in the panel or outside.

In accordance with the present invention, the safety and protection for electricity users is increased dramatically by improving and solving the issues described in the Background section.

The present invention achieves the following:
1. Reduction in the current leakage set point (<30 mA), thereby increasing the sensitivity for disconnecting the power supply. The invention use high accuracy, high resolution current sensors with high sample rates for continuous, reliable current leakage measurements. In case the system will recognize an out of spec current leakage value, the system will cut-off the current in the fastest time, and before the RCD operates. The system will cut off power only on the line with the failure and not the current for the whole panel.

In accordance with the present invention the inventive electrical panel provides improved RCD sensitivity by continuously monitoring and measuring the leakage currents by sensors to measure currents in the electrical circuit in each line on the phase and neutral conductors or on both. The leakage is the difference in the measured currents. The data is saved in a database and analyzed continuously learning and updating and natural leakage for each line.

The natural current leakage distribution in each line is studied with a machine learning algorithm and statistical calculation to find the behavior of the natural leakage on the line to set the value of the normal natural leakage of the usage of each line, at values not related to electrocution. This value is update continuously with every new measurement.

The natural leakage is a parameter that can be offset by subtraction from the measured leakage. The system will disconnect the current only when the value of the current leakage is beyond the value of natural current leakage and above the set threshold, or setpoint.

By learning the natural current leakage of each line, the protection against electrocution can be set for a much lower current. The RCD 30 mA or other setpoint is chosen because the natural current leakage is unknown, and the setpoint is for all the whole electrical circuit and all types of consumer products.

The inventive system operates to learn the natural leakage for each specific line, and is therefore more accurate and increases the sensitivity.

By using the value of the natural current leakage, which is offset from the measured leakage, the sensitivity against electrocution is increased because the disconnect will occur much before reaching the constant specified acceptable standard leakage of 30 mA.

2. Continuous testing of the ground integrity in the electrical panel is necessary to ensure the proper operation of the RCD, or an improved leakage detection system. Each ground line and the main ground are tested. Without a proper ground line, the RCD and any other leakage protection will not work. The ground integrity is tested by checking the resistance between neutral and ground, and measurement of phase-to-neutral voltage and comparison to measurement of phase-to-ground voltage.

3. Continuous testing of a proper neutral connection in the electrical panel is necessary to ensure the proper operation of the RCD. The neutral-line test is performed by few tests:

Comparing the measured values of voltages between phase-to-ground and phase-to-neutral. The measurement is performed in two places on each line and between the feeder lines, in addition to a comparison of the voltage value to the permissible range.

Current spikes, high temperature readings of the conductors, and differences in the measured voltage may reflect issues with the neutral line.

4. The current in the ground line is measured, and any current in the ground line will be considered as leakage above the natural leakage.

The system will specify a permissible leakage value, for example 5 mA or 10 mA, beyond the natural leakage. This value can be a different threshold for each line according to the load placed on the line, for example, where the line is only used for lights or chargers the threshold can be lower, while in a line with AC motor load, the threshold might be slightly more. In this way, the power cutoff in the event of electric shock will be at currents that are much lower than the standard current setting of 30 mA for better protection of human beings. The current cutoff will be by relays/controlled circuit breaker (like solid state relay (SSR) or others), according to the standard response time, or even in a shorter time.

Because the system will cutoff the current at a much lower leakage value, with a faster response, the cutoff will be before the RCD will react.

According to the invention, data is communicated to a hand-held user smartphone application for alerts, general power consumption, trends, etc., which are displayed in a user interface.

The inventive system features an improvement in the electrocution protection sensitivity. This is achieved by a test method incorporating the following steps:
1. The system reaction speed and accuracy is set to disconnect the power as fast as, or faster than the standard circuit breaker and the standard RCD.
2. Measure current in the phase line and the current in the neutral line for each line in the control panel.
3. Calculate the difference between the measured currents in the phase and neutral lines, or measure the current delta between phase and neutral.

The inventive system provides for the setting of parameters for safe operation:

Setting parameter 1: Specific limit for allowable leakage in mA.

The leakage is the current delta between the phase and the neutral measurements.

The leakage that is measured and calculated for each line (X), is saved as leakage value ($L_x$) for line X with a time stamp. This value is updated online with every current measurement.

The leakage value ($L_x$) is a calculation of the average leakage of line X in the last Y period of time. Y symbolizes how many days/time to include in the average calculation, such as a moving average, standard deviation, max, median or other statistical calculation to find any specific measurement parameter.

Every delta phase/neutral current measurement is compared to the leakage value ($L_x$).

Setting parameter 2: Allowable deviation in mA for alert only.

Setting parameter 3: Maximum deviation in mA to both disconnect currents and send alert, including measurement of current or voltage in ground line Setting parameter 4: Maximum current/voltage allowed in ground line, in mA or V, to disconnect currents.

The inventive system operates in accordance with measured parameters, and accordingly takes action as follows:
1. If there is a deviation from parameter 1—the system will disconnect the current supply to this line by relay phase and neutral and send an alert.
1. If there is a deviation in the value of parameter 2: an estimate will warn of a change in leakage as a sign of a problem in a line or a faulty device.

2. If there is a deviation from parameter 3—the system will disconnect the current supply to this line by relay phase and neutral and send an alert.
3. if there is a deviation from parameter 4—the system will disconnect the current supply to this line by relay phase and neutral and send an alert.

Returning the power supply to operation is done after the problem has been fixed—and the confirmation is shown in the application program by mobile/computer/screen displays on the electric panel.

Other parameters for safe operation are further described below.

There has thus been outlined, rather broadly, the more important features of the invention in order that the detailed description thereof that follows hereinafter may be better understood. Additional details and advantages of the invention will be set forth in the detailed description, and in part will be appreciated from the description, or may be learned by practice of the invention.

BRIEF DESCRIPTION OF THE DRAWINGS

For a better understanding of the invention with regard to the embodiments thereof, reference is now made to the accompanying drawings, in which like numerals designate corresponding elements or sections throughout, and in which.

DETAILED DESCRIPTION OF AN EXEMPLARY EMBODIMENT

The principles and operation of a method and an apparatus according to the present invention may be better understood with reference to the drawings and the accompanying description, it being understood that these drawings are given for illustrative purposes only and are not meant to be limiting.

Figure 1:
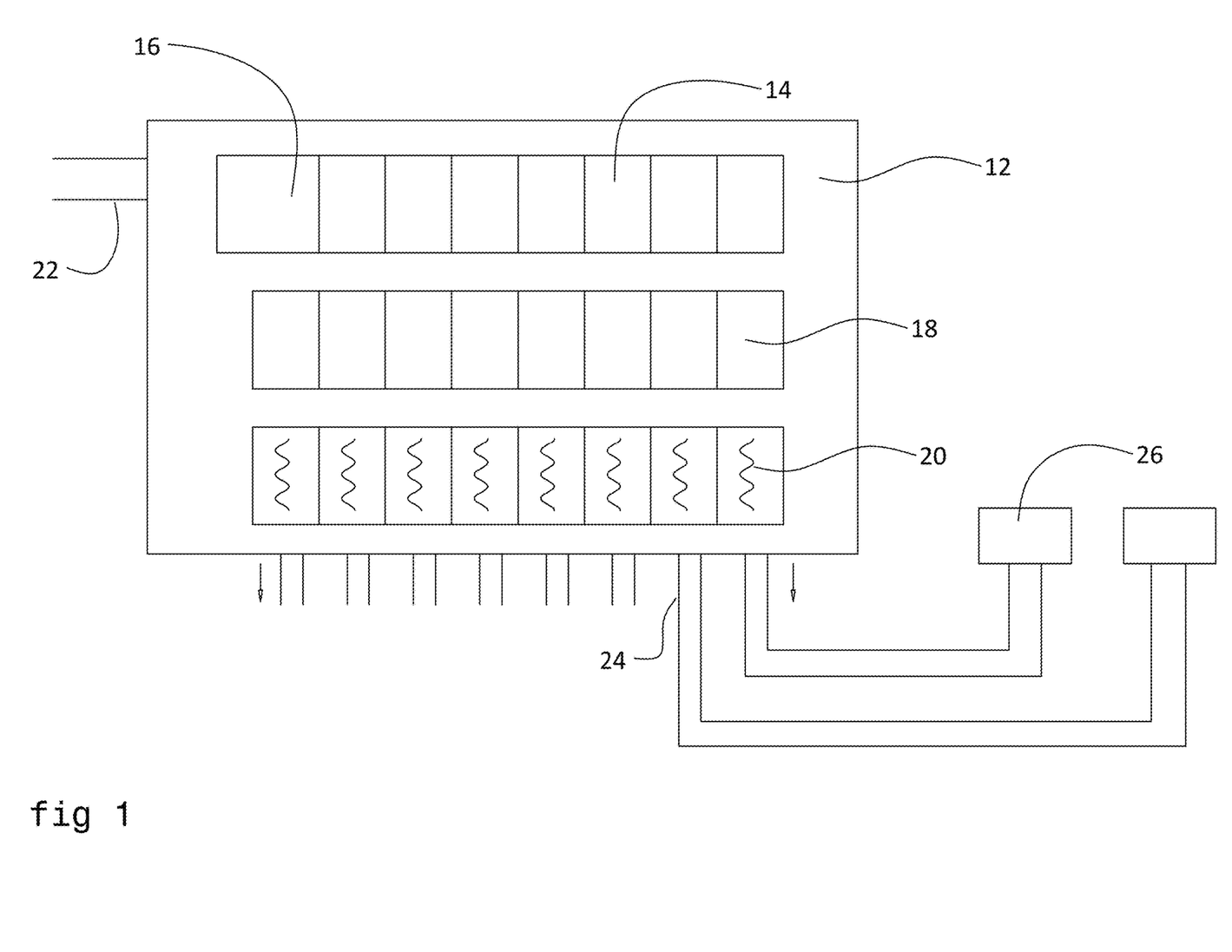
FIG. 1 schematically illustrates an electric panel controller.

FIG. 1 schematically illustrates an electric panel controller. Shown in the figure is an electric panel 12, including semi-automatic circuit breakers 14, an isolation breaker RCD 16, relays 18, sensors 20, and electrical conductors 22, which enter the panel, and electrical conductors 24, which leave the panel and supply electricity to customer distribution boxes 26.

Figure 2:
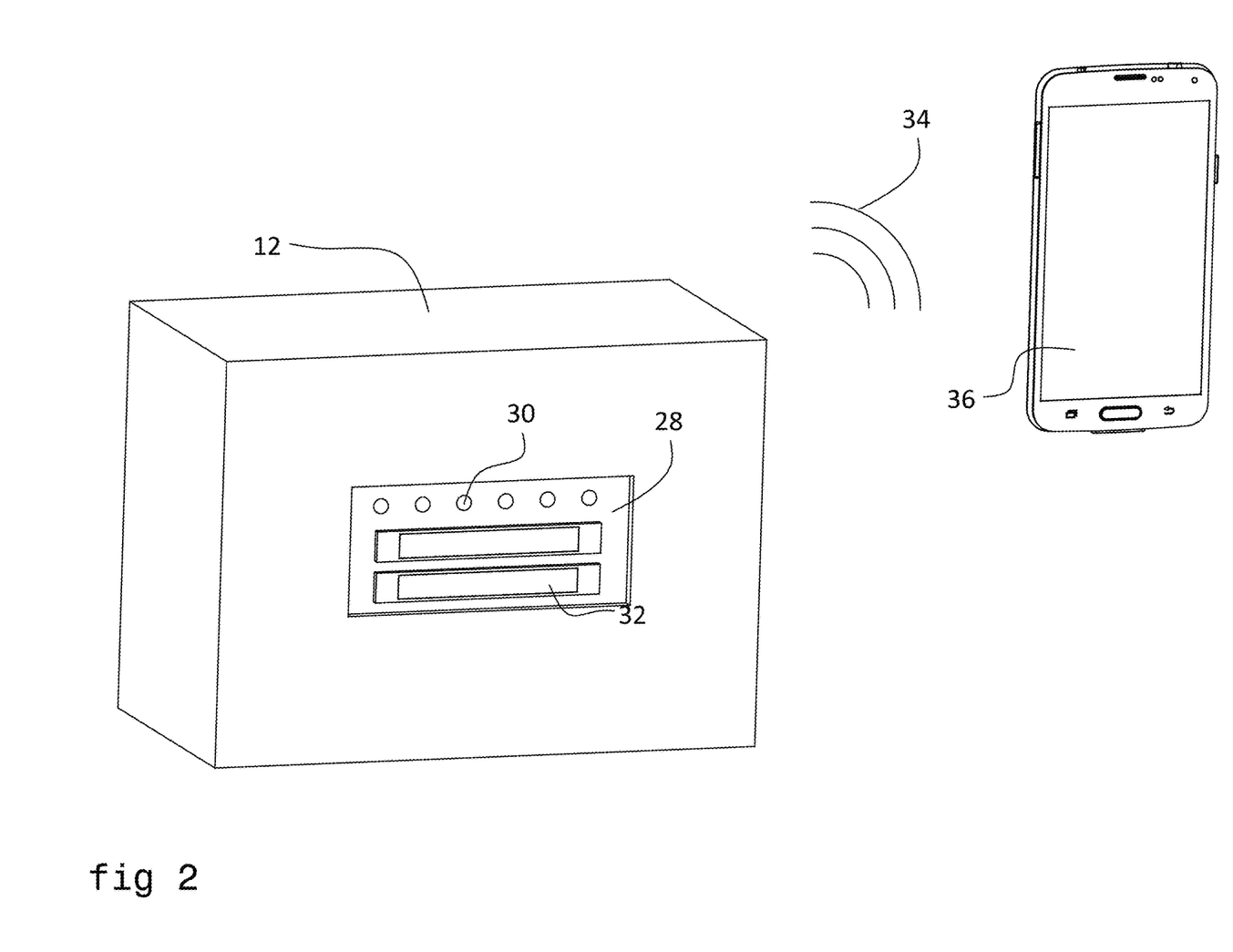
FIG. 2 schematically illustrates further details of the electric panel controller of FIG. 1 with data communication with the user by application user interface, constructed according to an embodiment of the present invention.

FIG. 2 schematically illustrates further details of the electric panel controller of FIG. 1. Shown in FIG. 2 is the electric panel 12 including a controller 28 with light indicators 30 and an alphanumeric display 32 which may transmit real-time information 34 to an application program in a mobile phone 36.

Figure 3:
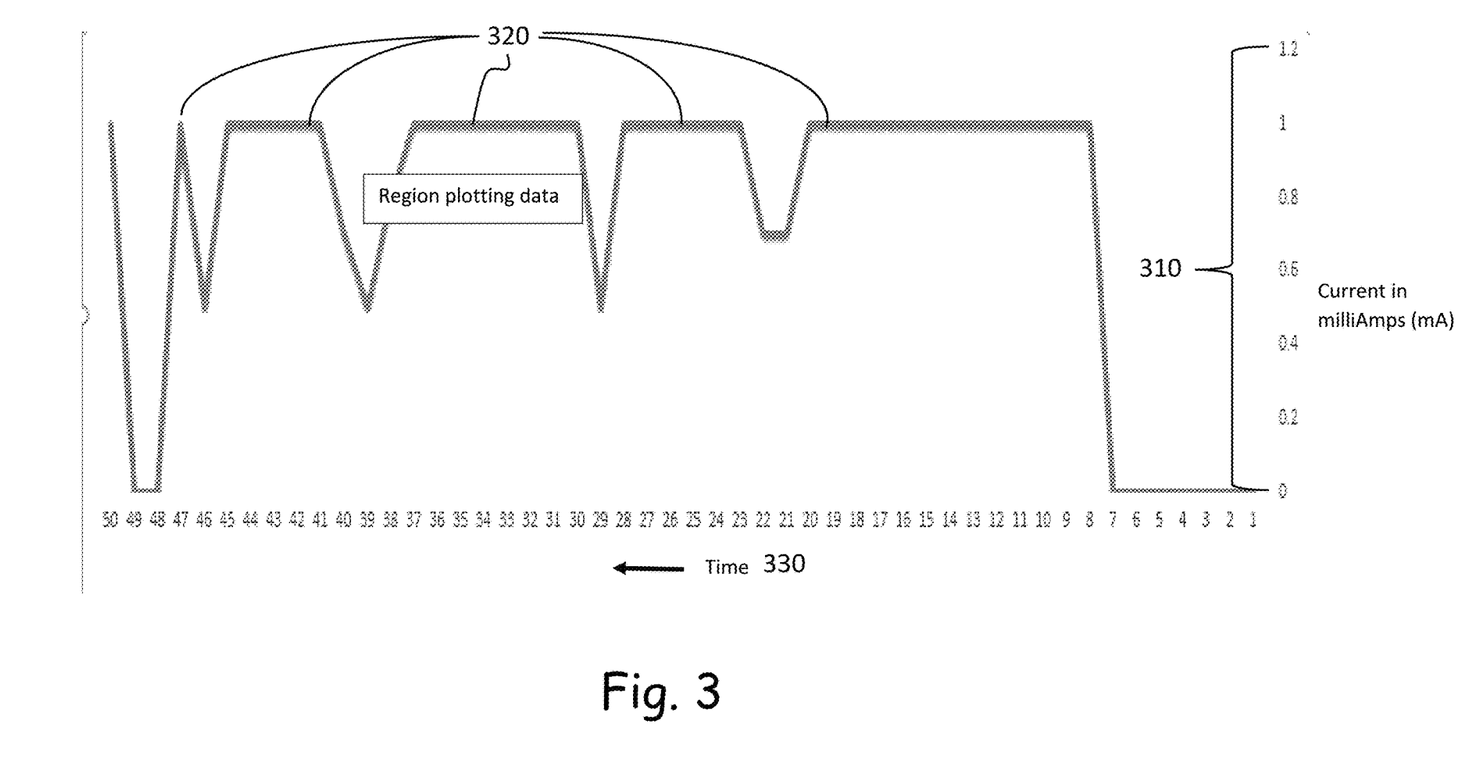
FIG. 3 is a graph of measured currents; surges can be attributed to loose connections.

FIG. 3 is a graph of measured currents 310 over time 330, with surges 320 that can be interpreted as loose connections.

The RCD sensitivity is improved by continuously monitoring and measuring the leakage currents by sensors to measure currents in the electrical circuit in each line on the phase and neutral conductors. The leakage is the difference in the measured currents. The data is saved in a database and analyzed. The natural current leakage distribution in each line is studied, and the natural leakage on the line can be compared to the measured leakage, and the current is disconnected only when there is a leakage current beyond the acceptable measured natural leakage current. The current or voltage in the ground line is measured, and any current or voltage in the ground line will be considered as leakage above the natural leakage, wherein the system performs accordingly.

Figure 4:
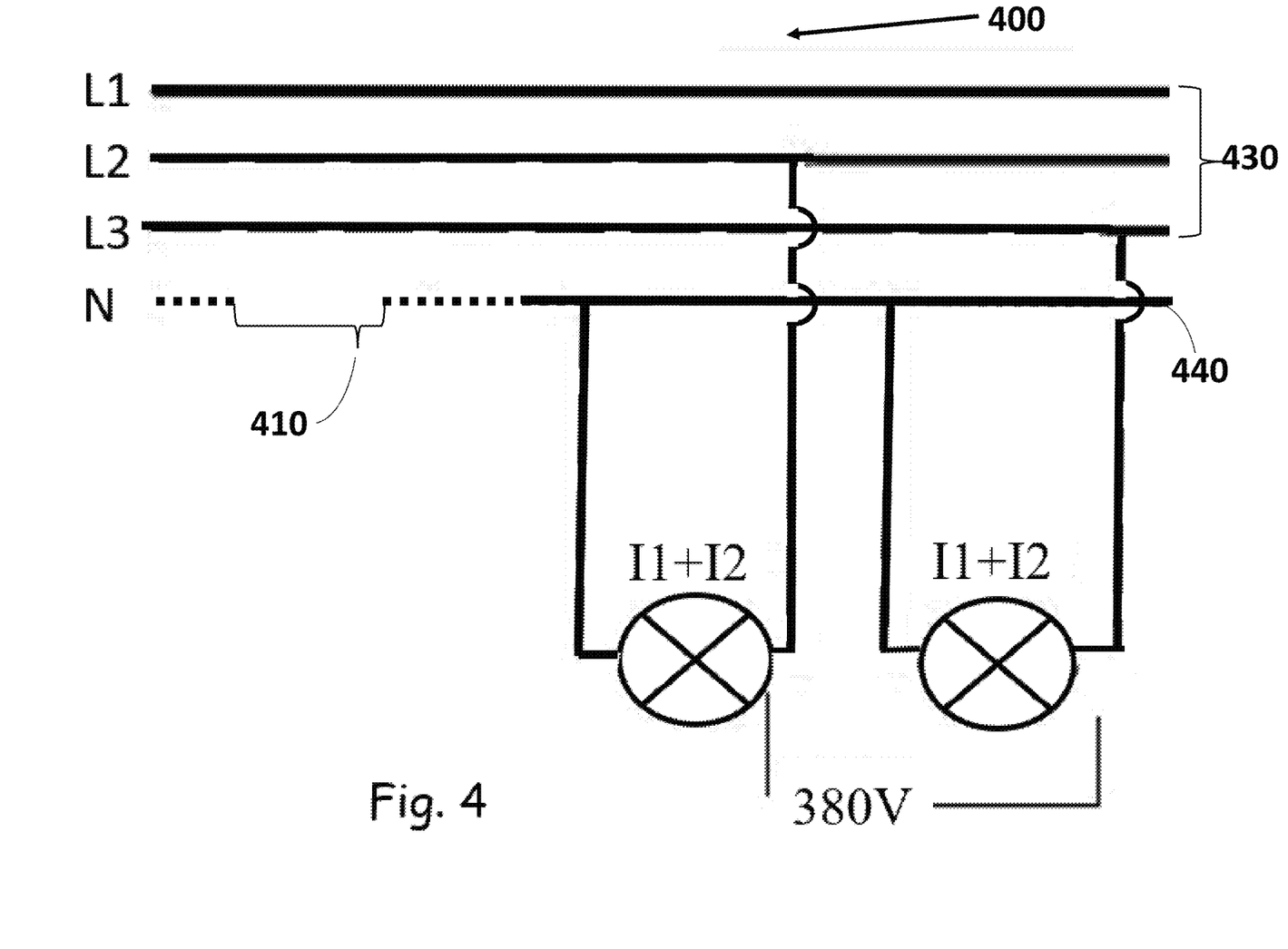
FIG. 4 is an example of a highly dangerous case where there is a disconnect in one of the neutral lines in a three-phase board.

FIG. 4 is an example of a case where there is a disconnect 410 in the neutral line 440 in a three-phase board 400. If there is physical contact with the neutral line 440 when there is a neutral line error, the danger of electric shock and death is real.

If a person touches the disconnected neutral line 440, this causes the human body to serve as neutral, and electrocution occurs at a high voltage between two of the phases 430, and the human damage is severe.

This is because a higher voltage will cause a higher current discharge during the resulting electrocution of the person that comes into contact with those lines. This type of electricity failure is also a possible cause of fire which presents a risk of injury and death. The following tests are performed relative to FIG. 4.

Neutral integrity testing is done in two ways:
1. Continuous measurement of the phase-to-neutral voltage and comparing this value to the phase-to-ground voltage.
2. Continuous measurement of electrical resistance between neutral and ground and comparing it to a fixed value in the system.

If a value exceeding the permitted values is found, the system alerts the user by visual message, sound alert, and in exceptional cases, by disconnecting the electrical current, and a message is sent about which line is experiencing a fault and the type of fault.

The leakage currents in the system are measured by comparing the current value in the phase and the current value in the neutral line. These values are supposed to be equal in a standard system. If there is a difference between the measured currents, the difference will be considered a leakage current. In order for the measurements to be correct and not due spurious noise in the system, the neutral line in the electric circuit is measured to detect the non-spurious faults in the neutral line that may be the result of loose connections that cause electricity lines to heat up, ignite fires and trigger consumer mishaps.

If the system does not have a proper neutral connection, the RCD does not function properly. The neutral-line test is performed by comparing the measured values of voltages between phase-to-ground and phase-to-neutral. The measurement is performed in two places on each line and between the feeder lines, in addition to a comparison of the voltage value to the permissible range. A voltage less than the permissible range, or surges in the voltage or current, may indicate a problem in the neutral line. In case of deviation from the fixed values in the system, the system will alert the user. In the event of deviations that could endanger the user or the installations, the system is disconnected from the power supply.

Figure 5:
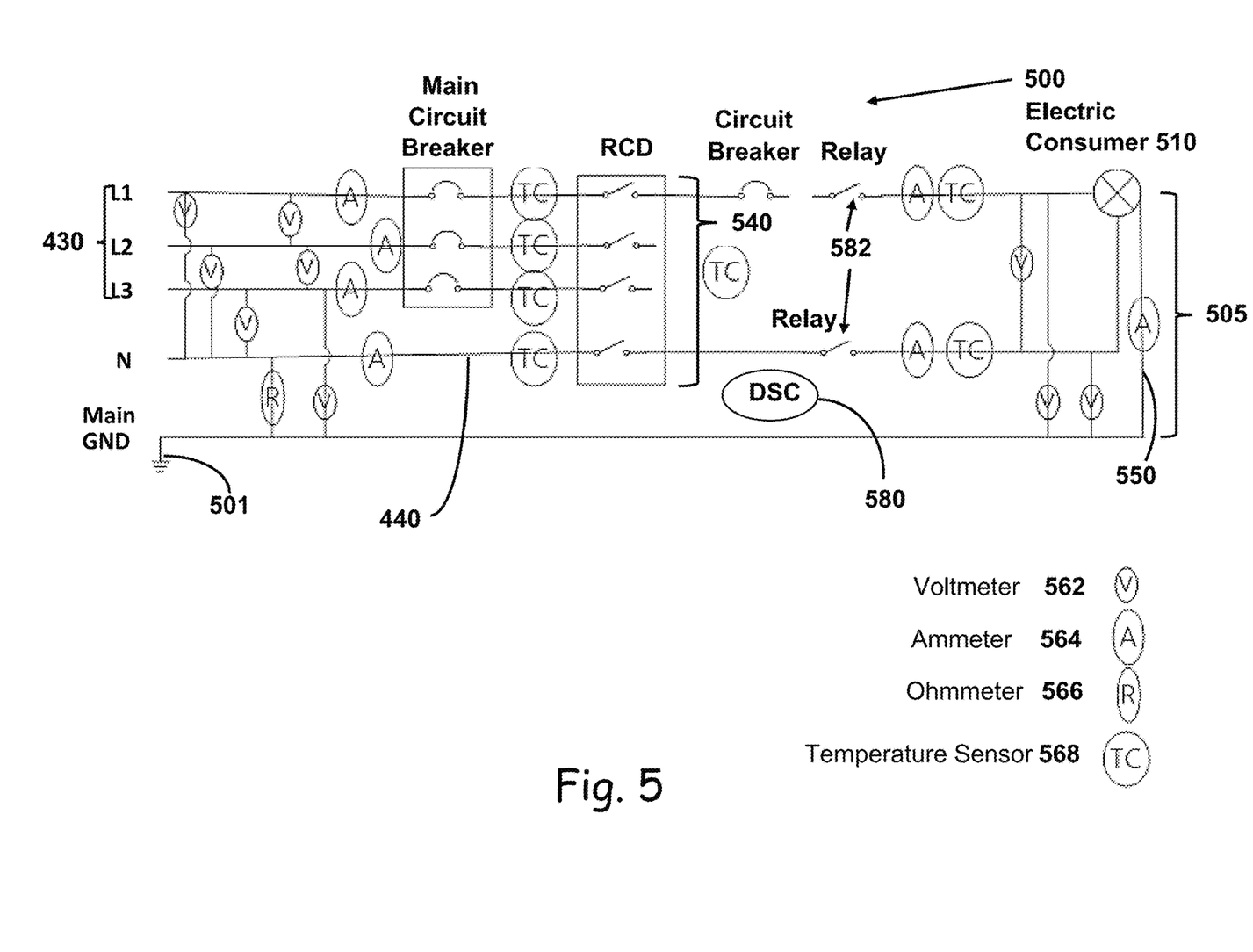
FIG. 5 is an electric circuit with additional sensors and actuators to demonstrate the inventive system schematic circuit, constructed according to an embodiment of the present invention.

FIG. 5 is a layout 500 of an electric panel 505, including sensors, for providing electric service to consumer 510, as fed by current/power source lines 430. The panel also includes the RCD 540, and is constructed according to an embodiment of the present invention. The main ground 501 is shown, as well as the ground 550 for each load line.

All sensors are connected to a database and system controller (DSC) 580. The database and system controller 580 monitors the data received from the sensors, and if there is a deviation of a parameter from within an allowable range, DSC 580 sends a signal to relays 582 to cutoff the power, as further described in FIG. 7. For example, if the maximum deviation of the setpoint threshold for leakage is detected, either an alert is sent or the power is cutoff via relays 582. Sensors: voltmeter 562, ammeter 564, ohmmeter 566, temperature sensor 568.

The ammeter 564 is measured for resolution of the current sensor for the phase conductor, as well as on the neutral conductor and the ground conductor. Ammeter 564 is a high accuracy device over a specific measurement range.

The system is enabled to perform the following tests:
Ground Testing:
Test Type 1:
  Check resistance between neutral and ground for main ground and each load line:
    Continuous testing—for high frequency.
Parameter 5: Maximum value allowed for resistance and alert.
Parameter 6: Maximum value allowed for resistance, disconnect and alert.
Test Type 2:
  Measurement of phase-to-neutral voltage and comparison to measurement of phase-to-ground voltage measurement, for main ground and each load line.
Parameter 7: Maximum voltage deviation between phase-to-neutral voltage and phase-to-ground.
Load Test—Connecting a consumer with a known resistance between phase and ground and measurement of current and voltage and comparison to a specification value.
Neutral Testing:
Test Type 3:
  A check of the primary neutral connection for each incoming power line and each load line:
    Measuring the voltage on each line between phase and neutral and comparing to the average voltage in the last N days in the incoming line, which is parameter 10, the maximum deviation percentage. Beyond this deviation an alert will be displayed and then the relevant line will be disconnected.
    Measurement of the voltage between phase to neutral shall be carried out with neutral load measured by the current of each load line to be defined as consumption of more than X (X=average consumption in the last N days, or other period).
    In addition to measuring phase-to-ground voltage and comparing phase to neutral voltage, if the grounding is normal (according to the grounding section) the result should be equal.

Other tests and monitoring performed by the inventive system are now described:
1. Measurement of Temperature in the Panel:
  Using a T/C/thermistor/PT or other temperature sensor, the temperature will be measured in the power panel on the conductors and in the connector terminals. The sensors are arranged to have an accuracy of 1 degree C. and the check is performed every X seconds.
  Temperature sensors will measure the temperature near electrical connections and in the space of the electric panel where they may be overloaded.
    Setting Parameter 8: Warning of excessive temperature in the conductors near the connections.
    Setting Parameter 9: Temperature to disconnect the conductors near the connections.
    Setting Parameter 10: General temperature alert in the panel.
    Setting Parameter 11: General temperature in the panel to disconnect.
2. Control and Inspection of the Input Voltage
  Measuring voltage between each phase to neutral.
  Comparison of allowed voltage to high or low range, parameter 12.
  For unacceptable deviation in any phase, the phase will be disconnected, and a warning will be displayed. Voltage will be restored when its value returns to the permissible range.
3. Line Delay after Power Failure.
  The system will be able to set for each line whether a delay is required after a power supply or proactive disconnection.
  On the lines where a delay has been set, it will be M minutes from the moment of disconnecting, and after determining that the voltage is restored to normal.
  The power supply to the system will be the closest to the main feed with protection.
4. Test Loose Connections:
  Using the data measured by the phase and neutral current meters of each line, including input lines, if there is a decrease and a sharp increase measured in the current in a short time (see FIG. 2 for example), the system will display an alert on a line where a loose connection is detected. It will be determined whether there is a correlation between the increase in temperature in these conductors.
5. Calculate Current Consumption Per Line:
  Use the current and voltage measurement data for each line.
Parameter 13: Summary of consumption from the beginning of the period to the present for each line+general summary; determine from which date the calculation period begins.
Parameter 14: Cost of kWh
  Graphical presentation of consumption.
  Notice of abnormal consumption on each line.
6. Reporting Power Consumption to the Electricity Provider Company:
  Power consumption is calculated, and reports are generated for electricity providers, and sent via the Internet connection, either monthly or on demand.
  The electricity provider company can use this information for the billing and to learn the power consumption level and to prepare its power supply system accordingly.
7. Remote Control of the Relays to Turn on/Off the Current for Each Line;
  Remote control will be done through the system application program, and will include the option to schedule power-up shut down, for example, for lighting, boilers etc.
  Additionally or as an alternative, the system will be connected to an infra-red (IR)/radio frequency (RF) device to be able to control the loads on the electrical panel and will switch them off and on—for example, an air conditioner.

8. Abnormal Level of Power Consumption and/or Non-Standard Operation:

The system will recognize abnormal current consumption according to the consumption history of each line, and will alert the user. The system will also recognize abnormal consumption related to non-standard hours, higher current consumption, etc.

9. Limiting the Flow of Current to a Point:

Using current consumption data on a given line, the system will calculate an average and standard deviation of current consumption in the last N days (or other time period), to determine whether there is excess consumption detected at X percent (Parameter 15). If such an excess is detected as compared with the behavior pattern of this line, the voltage will be disconnected, and the application will be notified that there is "an exception from the standard current consumption in this line." It will be determined whether the new device connected is approved.

The motivation for this action is to avoid supply high current when it is not necessary, for example: an electricity socket that is used most of the time only for charging the mobile phone can supply up to 10 A/16 A, and in case of malfunction the current will be infinity until the circuit breaker will disconnect the power supply and the damage will be high. The inventive system will learn the usage of each line and if the line use is for charging ~0.5 A, it will cut off the power when it will exceed the set up threshold and will alert the user to approve the current supply.

10. Periodic Testing for the RCD According to the RCD Manufacturer:

The system will remind the consumer that the RCD instrument should be tested on the board, including determining when the last test was performed.

The system will detect whether the power is disconnected by measuring the voltage or current from existing sensors in the input line connected at a system point before the RCD and after the RCD. When the above scenario is recognized, it will record that the RCD has been tested.

11. Automatic Periodic Testing for the RCD:

Further to Section 10, a standard leakage (off-the-shelf) product can be assembled with automatic return of voltage after X time.

Test the RCD when the minimum flow consumption is detected in the panel. The test will be done once every X days according to the manufacturer instruction (parameter 16) and the voltage will be returned automatically, and user intervention will not be required.

Before the test, the user will be notified that the system will perform the test in X days/hours and in the display windows, the message format can be determined by the user.

12. Overload Alert:

By using the currents measurements of each line, the system will alert the user if the current consumption of this line is X % (for example above 90%). For each line, this value will be defined according to the circuit breaker type (having a current limit) to which it is connected.

A load definition parameter will be defined as X % of the value of the current limit per the circuit breaker type, in order to avoid current cut off by the circuit breaker due to overload.

In addition, for 3-phase systems, the system will compare loads between the 3 phases. If there is an X difference in the Y time range at the phase loads, the system will display a message that should split the loads between the phases and recommend which line to move to any phase.

Figure 6:
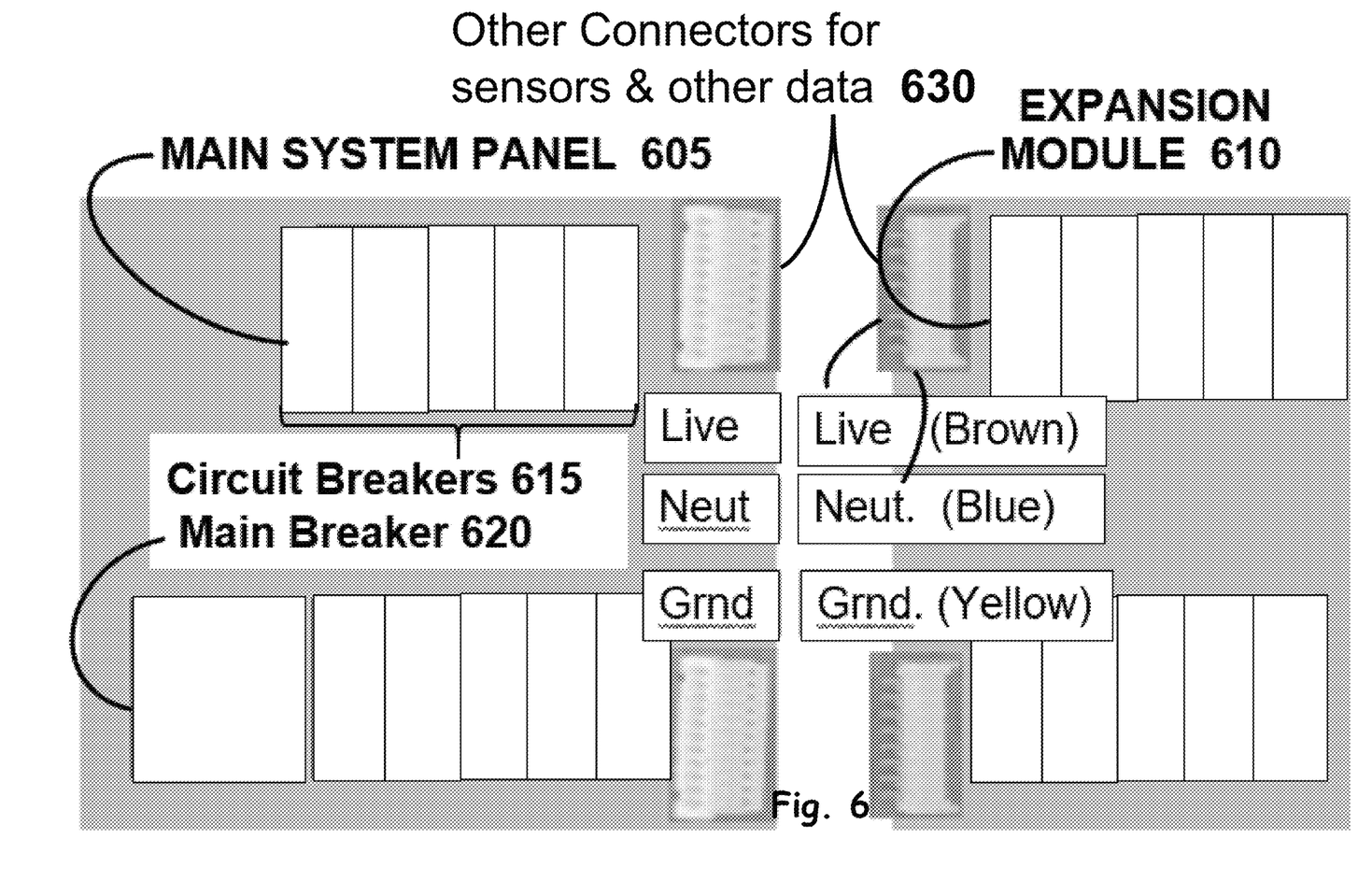
FIG. 6 is a schematic illustration of the control panel board that includes a number of lines, and the possibility of adding modular components or to connect additional lines, constructed according to an embodiment of the present invention.

FIG. 6 is a schematic illustration of the control panel board 605 that is arranged to include all the required sensors for the inventive system. Control panel board 605 includes a number of circuit breakers 615 for the lines, with the option of adding modular breakers 610 to connect additional lines. Expansion module 610 contains the required sensors that connect with the main controller of the system, constructed according to an embodiment of the present invention. A main breaker 620 is also shown.

Optional Control Panel Board Structure:

1. The board shall include all the components currently existing in the main board, circuit breaker and RCD.

2. The board will have a decorative cover, with a Liquid Crystal Display (LCD) panel or a touch screen placed inside.

3. The system will include an application that will be transmitted the data/information/alerts/control to the user via WIFI/RF/GSM/BT/web network and other.

4. The board includes a number of monitored lines, and the possibility of adding modules to connect additional lines. The additional modules only include the relevant sensors and relays, and will be controlled by the software after installation and definition.

Figure 7:
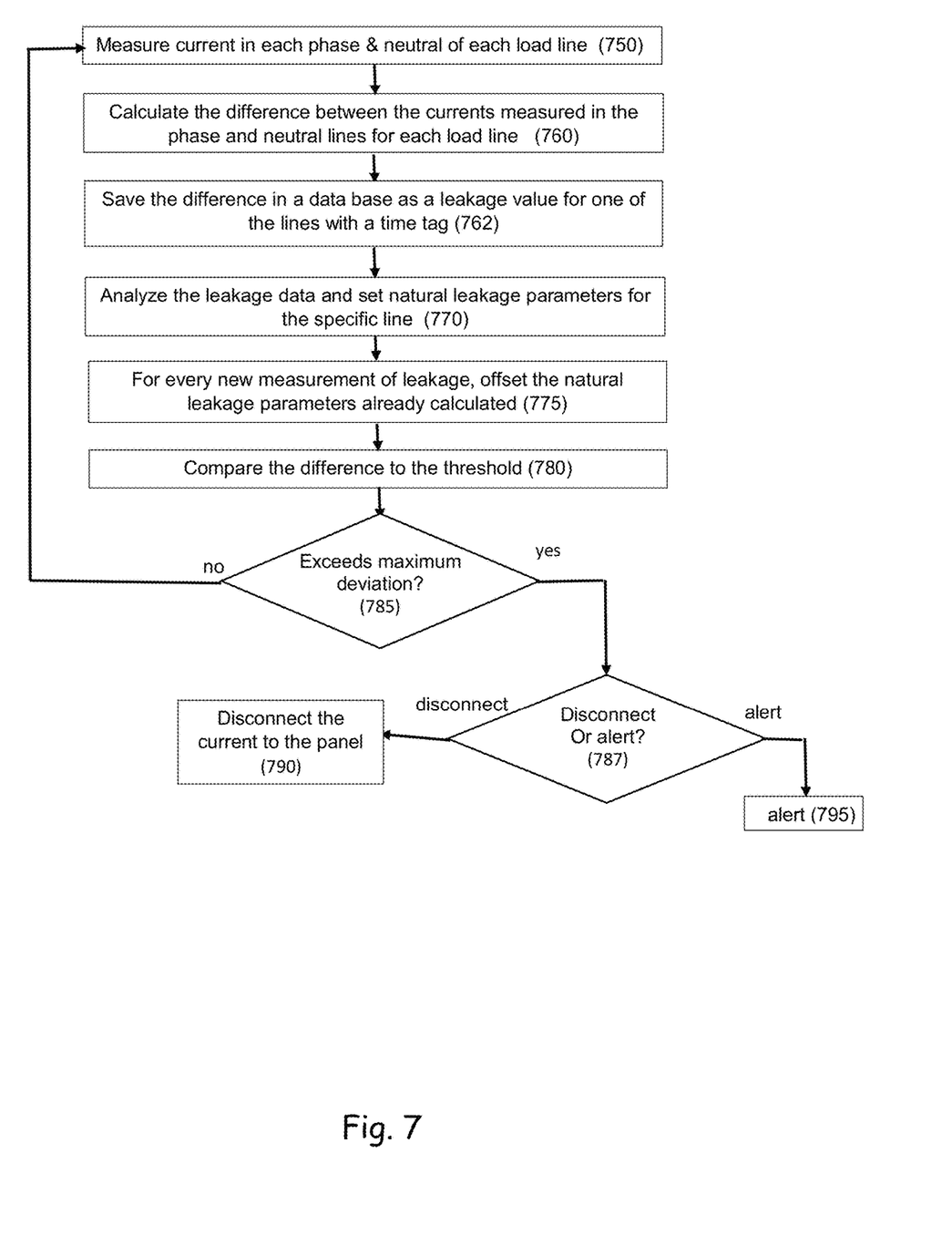
FIG. 7 is a flow chart for a method for measuring current and leakage sensitivity and responding over a time period in an electrical panel for a 3-phase system comprising phase lines X, Y and Z, wherein the system reaction and accuracy are critical to a decision to disconnect the line with the malfunction before the RCD cuts off power.

FIG. 7 is a flow chart for a method for measuring current and leakage sensitivity and responding over a time period in an electrical panel, wherein the system reaction and accuracy are critical to a decision to disconnect the line with the malfunction before the RCD cuts off power. In box 750, the current is measured in each phase and neutral of each line. The difference between the currents measured in the phase and neutral lines for each line is calculated in box 760. In box 762 the difference is saved in a data base as a leakage value for one of the lines with a time tag. The leakage data and set natural leakage parameters for the specific line are analyzed in box 770. In box 775 for every new measurement of leakage, the natural leakage parameters already calculated are offset, according to the definition wherein: Natural leakage=$X_1$, new measurement=$Y_1$ and the offset=$Y_1$–$X_1$=the difference. A comparison is made of the difference to the threshold in box 780. If the maximum deviation is exceeded, a decision is made in box 785, decide whether to disconnect or send an alert 787. If it is decided to disconnect, the current to the panel is disconnected in box 790. If it is decided to alert, an alert is sent in box 795.

While the invention has been described with respect to a limited number of embodiments, it will be appreciated that many variations, modifications and other applications of the invention may be made. Therefore, the claimed invention as recited in the claims that follow is not limited to the embodiments described herein.

We claim:

1. A method for monitoring, metering and improving system parameters, including residual current sensitivity setpoint and response over a time period in an electrical panel for a system having at least a single power incoming phase line X wherein a reaction and accuracy are critical to a decision to disconnect the power line with a malfunction prior to RCD (residual current device) operation at a standard setpoint for cutoff, said method comprising:

a. setting a leakage current threshold in mA (milliAmp) that can be changed in setup mode;
   b. setting allowable deviation in leakage current from said setpoint in mA for alert;
   c. setting maximum deviation in mA to disconnect currents;
   d. setting N time period to include in an average calculation for a natural leakage current;

e. measuring the difference in current between a main incoming phase and neutral lines; saving said difference in a data base as a natural leakage current value for line X with a time tag;

g. calculating the average value of the line X leakage current in the last N time period;

h. calculating the deviation of the current difference between the phase and the neutral for each load line at the present time, and the average value calculated for the last N time period for each load line;

i. measuring the current in the ground conductor and comparing it to said measured difference; and j. calculating the difference between the current measured in the phase line and the neutral line and resetting maximum deviation in mA to disconnect current, such that upon exceeding the maximum deviation, the current to the panel is disconnected.

2. The method of claim 1 wherein said natural leakage current is monitored continuously, and said maximum deviation is adjusted automatically, such that the residual current sensitivity setpoint is continuously updated.

3. The method of claim 1 wherein the electrical panel is tested continuously for a proper ground connection within a specified value, prior to performing the method.

4. The method of claim 1 wherein the electrical panel is tested continuously for a proper neutral connection within a specified value, prior to performing the method.

5. The method of claim 1 wherein the power is disconnected for each load line independently.

6. The method of claim 1 for a 3-phase system comprising phase lines X, Y and Z wherein the steps a-j are performed for the X line, and repeated for the Y and Z lines.

7. The method of claim 1 applied to temperature measurements, said method further comprising measuring the temperature near electrical connections and in the space of the electric panel where they may be overloaded, and performing the steps of:

warning by alert of excessive temperature in the conductors near the connections; and determining general temperature for disconnecting the power supply.

8. The method of claim 1 applied to voltage measurements, said method further comprising:

measuring voltage between each phase to neutral;

comparing to an allowable range;

in the event of a voltage deviation in a certain phase, disconnecting that phase and displaying a warning; and reconnecting the voltage when the voltage returns within a permissible range.

9. The method of claim 1 further comprising performing an insulation resistance test on the disconnected load line to check if a fault has been corrected.

10. The method of claim 1 further comprising sending a notice of abnormal consumption on the power line.

11. The method of claim 1 further comprising monitoring the distribution of loads between the incoming phase lines, and providing a notice said distribution is out of an allowable range.

12. The method of claim 1 wherein after a power cutoff, said power is restored to the electrical panel after a preset delay for each load line.

13. The method of claim 1 further comprising calculating power consumption, and generating reports and sending the reports via Internet connection as required.

14. The method of claim 1 further comprising monitoring the current consumption for each load line and automatically cutting off power if said consumption is beyond the typical usage.

15. The method of claim 1 for measuring, monitoring and learning the current consumption and the current leakage that exist in an electrical power circuit, in order cut off the power in the minimum current in case of electrocution and in the fastest time to avoid human injury.

* * * * *